(12) United States Patent
Terrovitis

(10) Patent No.: US 7,242,274 B2
(45) Date of Patent: Jul. 10, 2007

(54) INDUCTOR LAYOUT USING STEP SYMMETRY FOR INDUCTORS

(75) Inventor: Manolis Terrovitis, Berkeley, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 207 days.

(21) Appl. No.: 10/836,160

(22) Filed: Apr. 29, 2004

(65) Prior Publication Data

US 2005/0195061 A1    Sep. 8, 2005

Related U.S. Application Data

(60) Provisional application No. 60/550,000, filed on Mar. 3, 2004.

(51) Int. Cl.
*H01F 5/00* (2006.01)
(52) U.S. Cl. ...................................... 336/200
(58) Field of Classification Search .................. 336/65, 336/83, 200, 232; 257/531
See application file for complete search history.

(56) References Cited

U.S. PATENT DOCUMENTS 4,959,631 A * 9/1990 Hasegawa et al. ............. 336/83
5,884,990 A * 3/1999 Burghartz et al. ........... 336/200
6,943,658 B2 * 9/2005 Gardner ...................... 336/200

OTHER PUBLICATIONS

Burghartz et al.: "RF Circuit Design Aspects of Spiral Inductors On Silicon", IEEE Journal of Solid-State Circuits, vol. 33, No. 12, Dec. 1998, pp. 2028-2034.
Yue et al.: "Design Strategy of On-Chip Inductors for Highly Integrated RF Systems", Invited Paper, DAC New Orleans, LA 1999 ACM 1-58113-092-9/99/0006, pp. 982-987.
Greenhouse: "Design Of Planar Rectangular Microelectronic Inductors", IEEE Transactions On Parts, Hybrids, and Packaging, vol. PHP-10, No. 2, Jun. 1974, pp. 101-109.

* cited by examiner

*Primary Examiner*—Tuyen T. Nguyen
(74) *Attorney, Agent, or Firm*—Bever, Hoffman & Harms, LLP; Jeanette S. Harms

(57) ABSTRACT

A differential circuit layout can advantageously use step symmetry for inductors and mirror symmetry for the rest of the circuit. Interconnect segments can be used to connect the terminals of the inductors to other components in the circuit. These interconnect segments facilitate the transition from the step symmetry of the inductors to the mirror symmetry of the other components. To provide this transition, the terminals of an inductor and its associated interconnect segments are formed on a middle axis of the inductor. This mixed symmetry can advantageously cancel the common-mode magnetic field, reduce the parasitic inductor coupling, and balance parasitic wiring capacitances between the two sides of the differential circuit.

4 Claims, 5 Drawing Sheets

INDUCTOR LAYOUT USING STEP SYMMETRY FOR INDUCTORS

RELATED APPLICATIONS

This application claims priority of U.S. Provisional Patent Application 60/550,000, entitled "System And Method For Communication" filed Mar. 3, 2004.

BACKGROUND OF THE INVENTION

1. Field of the Invention

The present invention relates to an inductor layout and in particular to an inductor layout using step symmetry for the inductors and mirror symmetry for the rest of the circuit.

2. Description of the Related Art

Inductors can be used in many types of circuits. For example, in radio frequency (RF) circuits, inductors can be used in voltage-controlled oscillators (VCOs), low-noise amplifiers, and passive-element filters. In general, an inductor is a passive electrical device that stores energy in a magnetic field.

An inductor is physically formed using one or more turns of wire and has two terminals. FIG. 1 illustrates a layout of an exemplary spiral inductor 100 including an outer terminal 101 and an inner terminal 102. Inductor 100 is formed in a square pattern, which can provide more inductance for a given surface area and can be easily fabricated using standard integrated circuit techniques. In one technique, inductor 100 can be built on a substrate (e.g. silicon) using at least two metal layers. Specifically, a first metal layer can be used to form spiral coil 103 whereas a second metal layer can be used to form an underpass contact 104. Underpass contact 104 can be connected to inner terminal 102 using a via (not shown).

RF circuits are increasingly using differential techniques to achieve enhanced linearity, dynamic range, and output power. In a differential circuit, signals with equal magnitude and opposite phase are transmitted and processed using two sets of components. Of importance, both sets of components are ideally symmetrical with respect to each other. This symmetry can be used to reject common-mode coupling, which can otherwise result in interference and undesirably affect signal processing.

Mirror symmetry for a layout of a differential circuit is commonly used because of its effectiveness in providing identical parasitic wiring capacitances on both sides of the differential circuit, thereby simplifying computations taking into account these capacitances. For example, FIG. 2 illustrates a schematic of an exemplary bandpass filter 200 including devices, e.g. inductors 201 and capacitors 202 and 203, that can be formed using mirror symmetry (e.g. using inductor layouts 201' and 201").

However, in a differential circuit that includes inductors, current flows in opposite directions (indicated by arrows 206 and 207). Using the well known "right hand rule", the magnetic field generated by the inductor using layout 201' would be going into the plane including the inductor, which is shown by symbol 208. Unfortunately, the magnetic field using layout 201" would also be going into the plane including the inductor, which is shown by symbol 209 (i.e. the magnetic fields would be positioned in the same direction). A sensitive circuit positioned near this inductor pair may be adversely affected by this combined magnetic field.

In contrast, if step symmetry is used (for example, if both inductors of a differential circuit are instantiated using layout 201'), the net far field transmitted is zero, since the magnetic field generated by one inductor effectively cancels the magnetic field generated by the other. Sensitive circuits may thus be placed in proximity to inductor pairs in step symmetry with no substantial degradation.

Similarly, a magnetic field couples as a common-mode signal when inductor step symmetry is used. For example, FIG. 3 illustrates a schematic of bandpass filter 200 that can be formed using step symmetry (e.g. using inductor layout 201'). A magnetic field would therefore create a common-mode current in this inductor pair and can thus advantageously substantially cancel the effect of the coupled field.

In contrast, a magnetic field would couple as a differential signal if inductors in a differential circuit are instantiated using mirror symmetry (e.g. using inductor layouts 201' and 201"). Deleterious interference from a nearby circuit producing a magnetic field may result in this inductor configuration.

Unfortunately, using step symmetry makes balancing of parasitic wiring capacitances between the two sides of the differential circuit difficult. Therefore, a need arises for a technique and layout that provide the benefits of both mirror and step symmetries.

SUMMARY OF THE INVENTION

A differential circuit layout can advantageously use step symmetry for inductors and mirror symmetry for the rest of the circuit. Interconnect segments can be used to connect the terminals of the inductors to other components in the circuit. These interconnect segments facilitate the transition from the step symmetry of the inductors to the mirror symmetry of the other components.

To provide this transition, the terminals of an inductor and its associated interconnect segments are formed on a middle axis of the inductor. In one embodiment, the interconnect segment connected to the inner terminal of the inductor and the interconnect segment connected to the outer terminal are formed on opposite sides of the inductor. In another embodiment, these interconnect segments are formed on one side of the inductor.

A method of generating a layout for a differential circuit is also provided. This method includes positioning a pair of inductors using step symmetry and positioning a plurality of components using mirror symmetry. For each inductor, a first interconnect segment, which connects an inner terminal of the inductor to a first set of the plurality of components, can be provided. A second interconnect segment, which connecting an outer terminal of the inductor to a second set of the plurality of components, can also be provided. Notably, the inner terminal, outer terminal, first interconnect segment, and second interconnect segment can be placed on a middle axis of the inductor, thereby providing a transition between the step and mirror symmetries. In one embodiment, the steps in this method can be implemented using a computer running a software program.

Using a mixed symmetry in a differential circuit where inductors are formed using step symmetry and other components in the circuit are formed using mirror symmetry provides advantages associated with each type of symmetry. For example, the common-mode magnetic fields associated with an inductor pair can advantageously cancel each other. Moreover, the net magnetic field transmitted by a differential circuit that uses step symmetry for its inductors is much smaller than a differential circuit that uses mirror symmetry. Therefore, parasitic inductor coupling can be advantageously reduced with inductor step symmetry. Using mirror symmetry for the other components in the circuit can ensure identical parasitic wiring capacitances on both sides of a differential circuit, thereby improving the circuit's performance.

DETAILED DESCRIPTION OF THE FIGURES

In accordance with one feature of the invention, the inductor pairs of a differential circuit can be formed using step symmetry and the remainder of the components in the circuit can be formed using mirror symmetry. Interconnect segments can be used to connect the inductors to other components in the circuit. These interconnect segments facilitate the transition from the step symmetry of the inductors to the mirror symmetry of the rest of the circuit.

Figure 1:
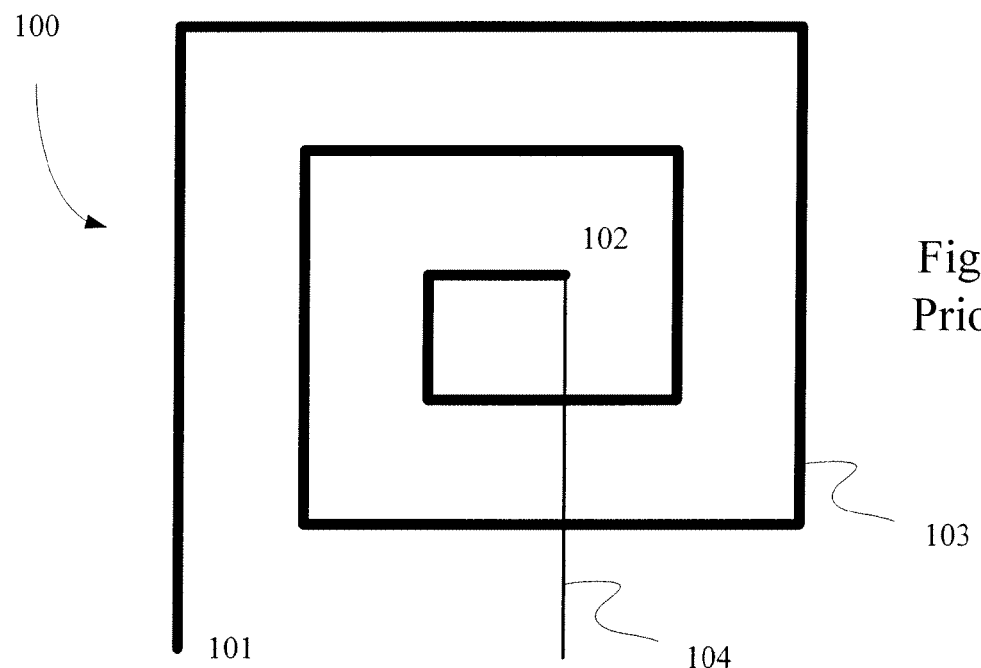
FIG. 1 illustrates a layout of an exemplary spiral inductor.
Figure 2:
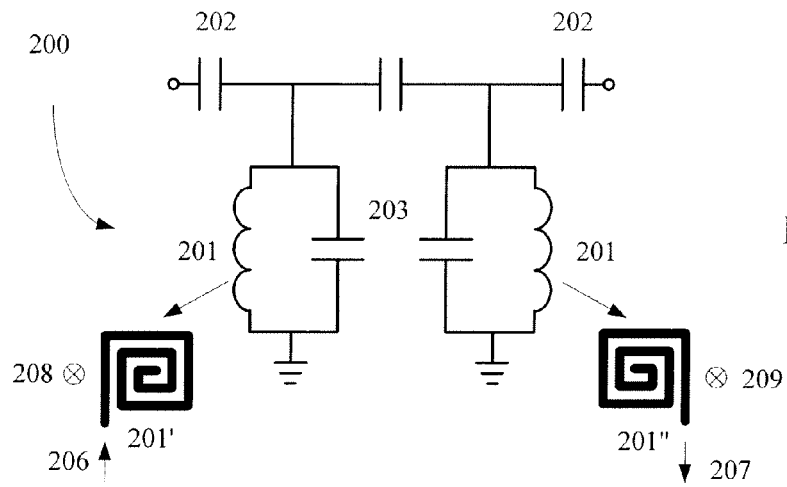
FIG. 2 illustrates a schematic of an exemplary bandpass filter including devices that can be formed using mirror symmetry.
Figure 3:
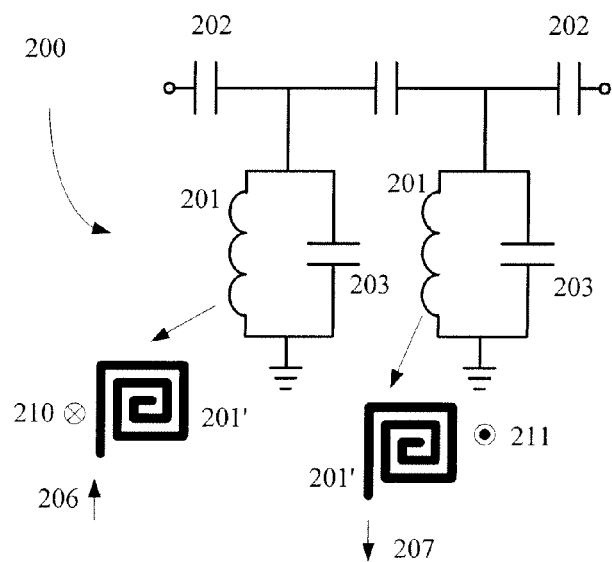
FIG. 3 illustrates a schematic of the exemplary bandpass filter of FIG. 2 including devices that can be formed using step symmetry.
Figure 4:
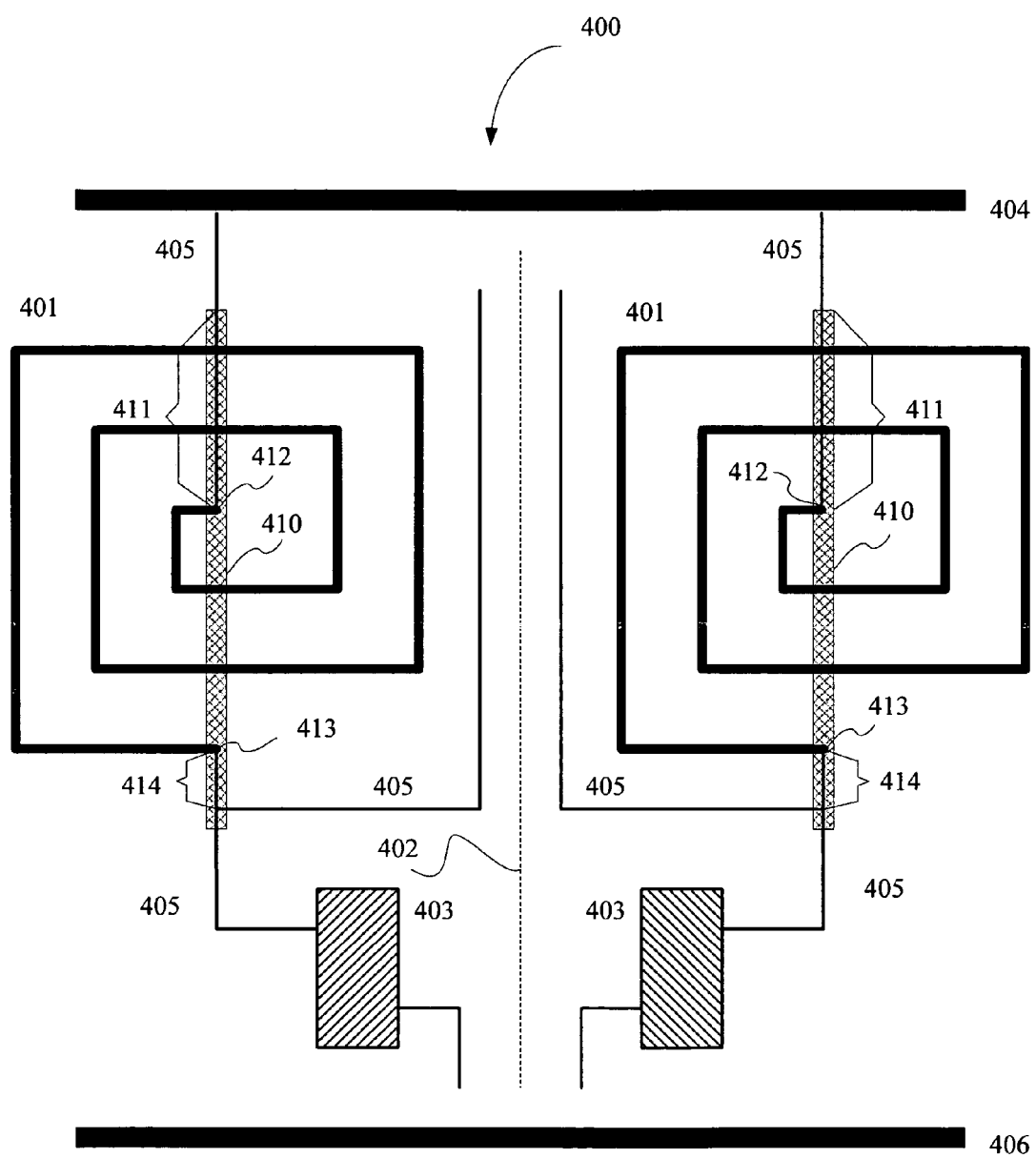
FIG. 4 illustrates a layout of a simplified differential circuit including inductors formed using step symmetry and other components formed using mirror symmetry. In this embodiment, the inner and outer terminals of each inductor are positioned in the middle of the inductor and the interconnect segments connected to the inner and outer terminals of the inductor are provided on opposite sides of the inductor.

FIG. 4 illustrates a simplified layout of a differential circuit 400 including inductors 401, which are formed using step symmetry. Of importance, an inner terminal 412 and an outer terminal 413 of each inductor 401 as well as their associated interconnect segments 411 and 414, respectively, are formed on a middle axis of the inductors, as indicated by a middle axis 410. In other embodiments incorporating different inductor layouts, inner terminal 412 and outer terminal 413 may simply be referred to as first terminal 412 and second terminal 413. Interconnect segments 411 and 414 allow a layout to smoothly transition between the step symmetry of inductors 401 to the mirror symmetry of the rest of the differential circuit.

In this configuration, because inner terminals 412 and outer terminals 413 as well as interconnect segments 411 and 414 are formed along middle axis 410, the other components in circuit 400 can be advantageously formed using mirror symmetry. Such other components can include, for example, transistors, resistors, capacitors, general interconnect, and voltage sources. In circuit 400, interconnect segments 411 can connect inner terminals 412 of inductors 401 to a voltage source 404 (e.g. VDD) via a general interconnect 405 whereas interconnect segments 414 can connect outer terminals 413 of inductors 401 to transistors 403 via general interconnect 405.

Notably, transistors 403 would have mirror symmetry with respect to each other (shown by a different fill pattern) based on an axis of symmetry 402. Another voltage source 406, e.g. VSS, may be coupled to transistors 403 or other components in circuit 400 also in a mirror coupling (not shown for clarity).

Figure 5:
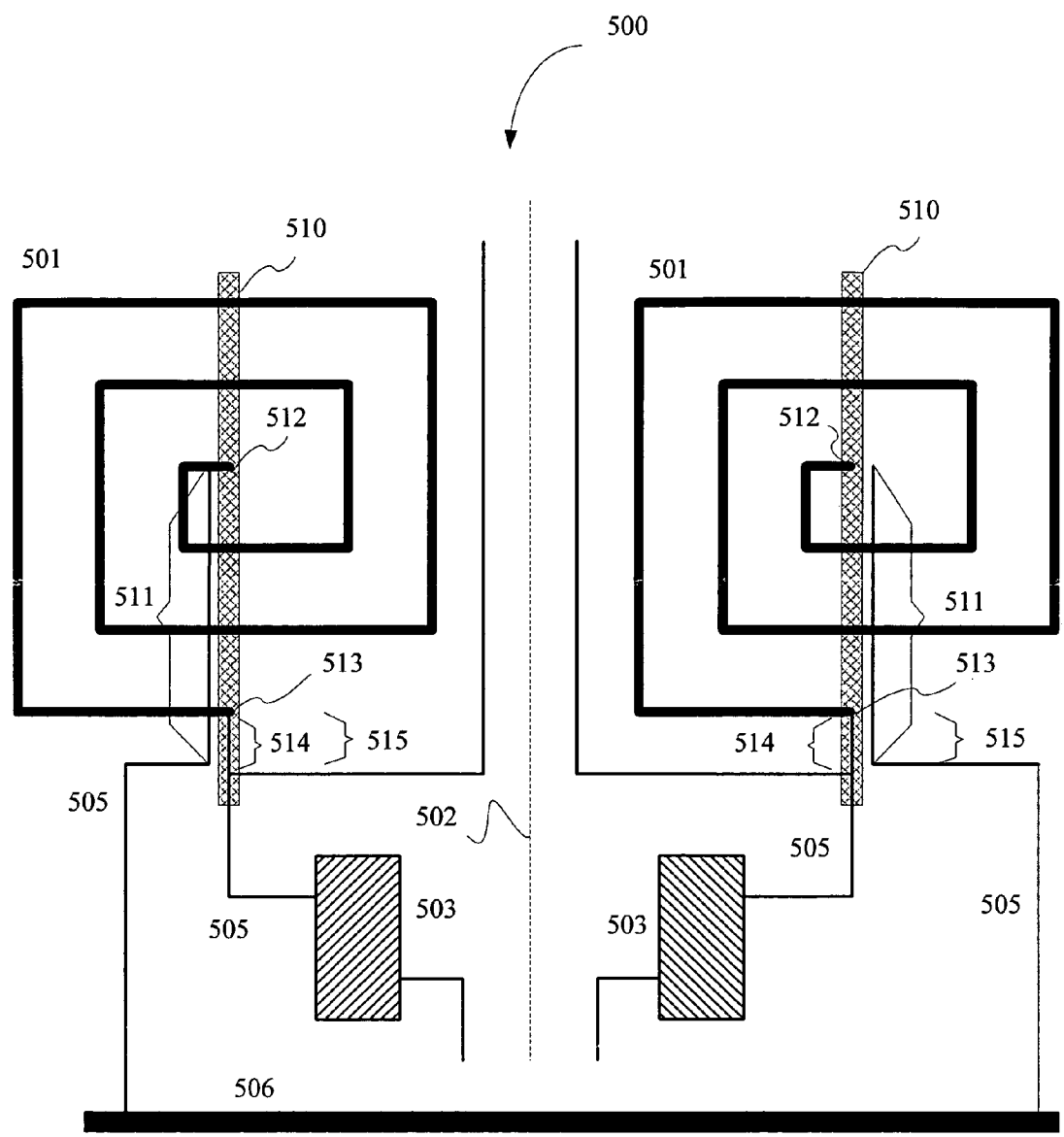
FIG. 5 illustrates a layout of another simplified differential circuit including inductors formed using step symmetry and other components formed using mirror symmetry. In this embodiment, the inner and outer terminals of each inductor are positioned in the middle of the inductor and the interconnect segments connected to the inner and outer terminals of the inductor are provided on one side of the inductor.

The above-described mixed symmetry can be applied to many different layouts as long as the inductor terminals and their associated interconnect segments are formed on a middle axis of the inductor. For example, mixed symmetry can also be used when the inner and outer terminals are coupled to components on the same side of the inductor as shown in FIG. 5. For example, FIG. 5 illustrates a simplified layout of a differential circuit 500 including inductors 501, which are formed using step symmetry.

Inner terminal 512 and outer terminals 513 as well as their associated interconnect segments 511 and 514, respectively, are advantageously formed on a middle axis 510 of inductors 501, thereby facilitating the mirror symmetry used by the rest of circuit 500. In other embodiments incorporating different inductor layouts, inner terminal 512 and outer terminal 513 may simply be referred to as first terminal 512 and second terminal 513. In this layout, using interconnect segments 511, inner terminals 512 of inductors 501 can be connected to a voltage source 506, e.g. VSS, via general interconnect 505. Using interconnect segments 514, outer terminals 513 can be connected to capacitors 503.

Note that interconnect segments 511, which should be connected to inner terminals 512, are slightly offset in FIG. 5 merely to distinguish from interconnect segments 514, which connect to outer terminals 513. Specifically, without this offset, interconnect segments 511 and 514 would appear to be overlapping. That is, interconnect segments 511 are formed in a different metal layer than interconnect segments 514. Thus, because FIG. 5 superimposes the layouts from both metal layers, interconnect segments 511/514 would, without the offset, have portions 515 that overlap.

Notably, because inner terminals 512 and outer terminals 513 as well as their associated interconnect segments 511 and 514, respectively, are formed along a middle axis 510 (i.e. in the middle of inductors 501), other components in circuit 500, including capacitors 503, general interconnect 505, and voltage source 506 can be formed using mirror symmetry based on an axis of symmetry 502.

Figure 6:
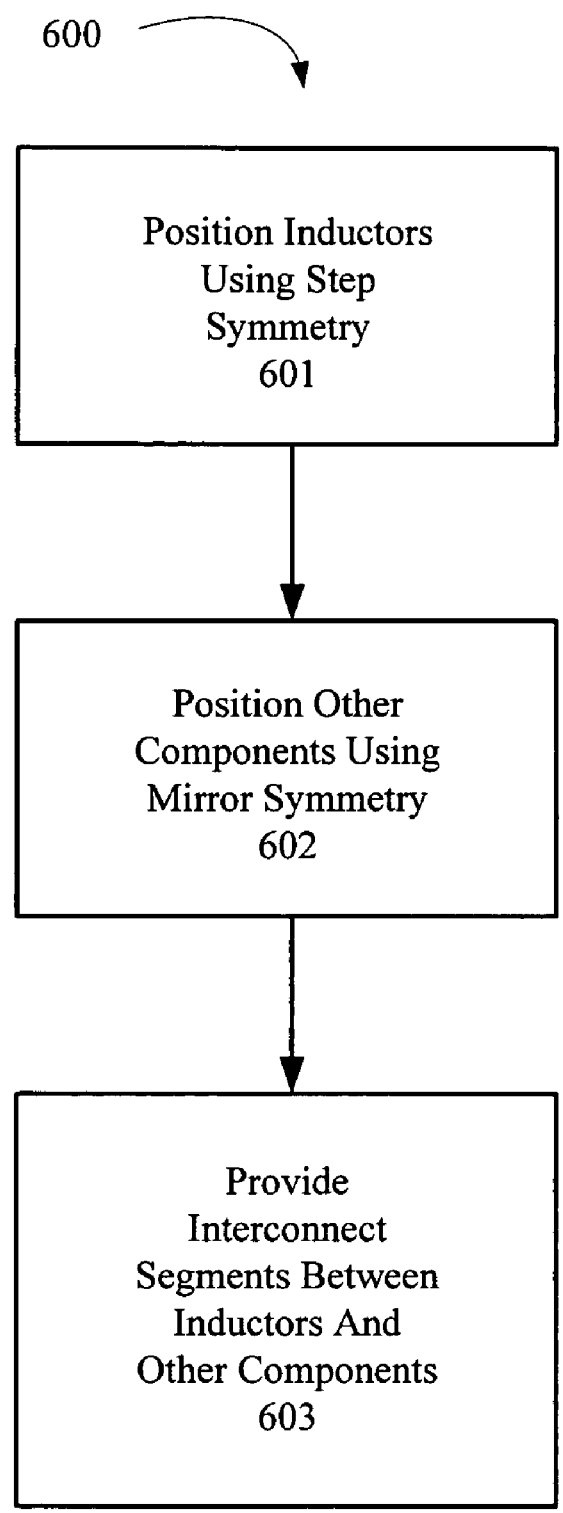
FIG. 6 illustrates a flow chart of a method of generating a layout for a circuit wherein the inductors are positioned using step symmetry and other components in the circuit are positioned using mirror symmetry.

FIG. 6 illustrates a flow chart of a mixed symmetry method 600 to generate a layout for a differential circuit. In step 601, pairs of inductors can be positioned using step symmetry. In step 602, other components in the circuit can be positioned using mirror symmetry. In step 603, interconnect segments can be provided between the inductors and other components in the circuit. As described above, these interconnect segments facilitate the transition from the step symmetry of the inductors to the mirror symmetry of the other components. In one embodiment, the steps of method 600 can be implemented using instructions from a computer-implemented program. Advantageously, the mixed symmetry technique can provide the benefits associated with both step and mirror symmetries.

Specifically, step symmetry can advantageously cancel the common-mode magnetic field created by the inductor pair. Additionally, the net magnetic field transmitted by a differential circuit that uses step symmetry for its inductor pairs is much smaller than a differential circuit that uses mirror symmetry for its inductor pairs. Therefore, parasitic inductor coupling in a differential circuit can be advantageously reduced using step symmetry for inductor pairs.

For example, in a divider with inductors instantiated in mirror symmetry an I/Q imbalance may result in a wireless LAN (WLAN) device. This I/Q imbalance can significantly decrease the sideband suppression (e.g. from 40 dB to 30 dB), thereby adversely affecting performance of the WLAN device.

Furthermore, using mirror symmetry for the other components in the differential circuit can advantageously balance parasitic wiring capacitances between the two sides of the circuit. Notably, as the operating frequency of a differential circuit increases, the balancing of the parasitic wiring capacitances may become critical.

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

For example, the mixed symmetry technique can be applied to any type of inductor. Note that the actual inductance generated by that inductor is dependent on the physical properties of the inductor, e.g. the number of turns and the total length of the coil. Therefore, the location of the inductor terminals, i.e. on the middle axis, can affect the inductance generated by that inductor. Known computer-implemented tools can work with such inductor parameters to generate an appropriate inductor having specific physical properties. One such computer-implemented tool is the CAD ASITIC tool, which was developed by Ali Niknejad.

Moreover, although circuits 400 and 500 could be implemented in a differential amplifier, the mixed symmetry technique can be used in other types of devices including, but not limited to, dividers, or any differential stage that requires inductive loading.

Accordingly, it is intended that the scope of the invention be defined by the following Claims and their equivalents.

The invention claimed is:

1. A layout for a differential circuit, the layout comprising:
   a pair of inductors, each inductor having a first terminal and a second terminal; and
   a plurality of components in operative relation to the pair of inductors,
   wherein the pair of inductors are formed using step symmetry and the plurality of components are formed using mirror symmetry,
   further including for each inductor:
   a first interconnect segment connecting the first terminal to a first set of the plurality of components; and
   a second interconnect segment connecting the second terminal to a second set of the plurality of components,
   wherein the first terminal, second terminal, first interconnect segment, and second interconnect segment are formed on a middle axis of the inductor.

2. The layout of claim 1, wherein the first and second interconnect segments are formed on opposite sides of the inductor.

3. The layout of claim 1, wherein the first and second interconnect segments are formed on one side of the inductor.

4. The layout of claim 1, wherein the first interconnect segment is to be formed from a first metal layer and the second interconnect segment is to be formed from a second metal layer.

* * * * *